United States Patent
Nemoto et al.

(10) Patent No.: US 8,227,265 B2
(45) Date of Patent: Jul. 24, 2012

(54) METHOD OF MEASURING PATTERN SHAPE, METHOD OF MANUFACTURING SEMICONDUCTOR DEVICE, AND PROCESS CONTROL SYSTEM

(75) Inventors: Kana Nemoto, Fujisawa (JP); Shunichi Matsumoto, Yokohama (JP); Yasuhiro Yoshitake, Yokohama (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 74 days.

(21) Appl. No.: 12/823,024

(22) Filed: Jun. 24, 2010

(65) Prior Publication Data
US 2011/0020956 A1 Jan. 27, 2011

(30) Foreign Application Priority Data
Jul. 22, 2009 (JP) .................................. 2009-171111

(51) Int. Cl.
*H01L 21/66* (2006.01)
(52) U.S. Cl. .................... 438/7; 438/5; 438/14; 438/16; 356/612
(58) Field of Classification Search ....... 438/7; 356/612
See application file for complete search history.

(56) References Cited

U.S. PATENT DOCUMENTS

| 7,052,920 B2 * | 5/2006 | Ushio et al. ...................... 438/14 |
| 7,079,975 B1 * | 7/2006 | Halliyal et al. ................ 702/172 |
| 7,348,192 B2 * | 3/2008 | Mikami .......................... 438/16 |
| 7,662,649 B2 * | 2/2010 | Blomiley et al. ............... 438/16 |
| 2001/0017695 A1 * | 8/2001 | Imao et al. .................. 356/237.5 |
| 2004/0155309 A1 * | 8/2004 | Sorin et al. .................... 257/433 |

FOREIGN PATENT DOCUMENTS

| JP | 2004-219343 A | 8/2004 |
| JP | 2008-530519 A | 8/2008 |
| WO | WO 2006/076484 A2 | 7/2006 |

* cited by examiner

*Primary Examiner* — Angel Roman
(74) *Attorney, Agent, or Firm* — Miles & Stockbridge P.C.

(57) ABSTRACT

A method of measuring a pattern shape of performing a shape measurement of a semiconductor pattern at a high accuracy even when a process margin is narrow with respect to miniaturization of a semiconductor device is provided. In the method of measuring a pattern shape, when a best-match calculated waveform cannot be selected, at least one parameter among shape parameters is set as a fixed value based on information obtained by another measurement apparatus that uses a measurement method independent to the pattern shape measurement, a matching of a library and a detected waveform is performed again, a best-match calculated waveform is selected, and shape information of an object pattern is obtained from the best-match calculated waveform.

20 Claims, 17 Drawing Sheets

METHOD OF MEASURING PATTERN SHAPE, METHOD OF MANUFACTURING SEMICONDUCTOR DEVICE, AND PROCESS CONTROL SYSTEM

CROSS-REFERENCE TO RELATED APPLICATION

The present application claims priority from Japanese Patent Application No. 2009-171111 filed on Jul. 22, 2009, the content of which is hereby incorporated by reference into this application.

TECHNICAL FIELD OF THE INVENTION

The present invention relates to a manufacture technology of a semiconductor device. More particularly, the present invention relates to a technology effectively applied to an in-line measurement technology of a pattern shape performed after an exposure process and/or an etching process.

BACKGROUND OF THE INVENTION

Miniaturization of semiconductor devices has been advanced in recent years and the process margin in device manufacture has been narrowed very much. In such a situation, it is important to manage the size of miniaturized patterns as a way of process management for eliminating failure of products and improving yield.

Here, in FIGS. 13 and 14, examples of currently used processes to which a pattern measurement is used in a semiconductor device manufacture are illustrated. FIGS. 13 and 14 are diagrams each illustrating an example of a process in a conventional semiconductor device manufacture in which a pattern measurement is used.

First, an oxide film and/or a metal film are formed on a semiconductor wafer in a process of deposition 20. Then, in a thickness measurement 21, a measurement is performed to check whether thicknesses of the formed films are uniform and satisfying a value of standard. When the measurement is cleared, a photosensitive resin film is applied in a resist application process in a lithography 22 as a next process, and then light is irradiated onto the semiconductor wafer through a mask in an exposure process.

Thereafter, in a development process, a part irradiated with the light is melted by a development solution when using a positive resist, and the part irradiated with the light remains when using a negative resist, thereby forming a resist pattern. When the process of the lithography 22 is finished, in an in-line measurement 23, a measurement of a size of the object pattern by CD-SEM (critical dimension scanning electron microscope), and a measurement of a shape of the object pattern by scatterometry are performed.

Thereafter, in an etching 24, a pattern is formed to the oxide film or metal film, and an in-line measurement 25 is performed in the same manner as the in-line measurement 23. Note that the "in-line measurement" is a measurement process embedded as one process in a device manufacture process, more specifically, it is a measurement process returns the wafer to the line again after the measurement.

In addition, as illustrated in FIG. 14, a result of the in-line measurement 23 is fed back to the lithography 22 and fed forward to the etching 24, and a result of the in-line measurement 25 is fed back to a manufacture apparatus of the etching 24, thereby performing process control for maintaining the pattern size.

Further, an example of a measurement object pattern is illustrated in FIGS. 15A and 15B. FIGS. 15A and 15B are diagrams illustrating schematic cross-sectional views of a wafer and a process flow in a conventional contact-hole forming process.

The wafer has a multi-layered configuration of a silicon (Si) substrate 40, a silicon oxide ($SiO_2$) film 41 (wiring interlayer film), and a photoresist 42. A photoresist pattern formation is performed in FIG. 15A, and a pattern formation to the $SiO_2$ film 41 by dry etching is performed in FIG. 15B so that a contact hole 43 is formed. Since a connection portion between a diffusion layer and a metal wiring layer such as the contact hole 43 has a small margin in the device manufacture, measurement and management of a size of the bottom of the hole is particularly expected to bring a yield improving effect by early discovery of failure.

As a measurement method of a miniaturized pattern, currently, CD-SEM is in the mainstream. A principle of CD-SEM is such that primary electrons emitted from an electron gun are irradiated onto a measurement sample, then secondary electrons evacuated from the sample are captured by a detector, and a size of the object pattern is measured from obtained intensity distribution of the secondary electrons.

In addition, an optical pattern shape measurement apparatus capable of obtaining three-dimensional shape information, for example, line width, height, sidewall angle, called scatterometry has been introduced in recent years.

Here, a measurement principle of the scatterometry is illustrated in FIG. 16.

First, in a step 51, a measurement model is created from information such as property values (refractive index, absorption coefficient), shape, and/or base film thickness, and, in a step 52, a calculated waveform is calculated from the created measurement model.

Next, in a step 53, a simulation is performed with sequentially changing shape parameters and a library is created from a plurality of calculated waveforms obtained.

Then, in a step 54, spectral waveforms are obtained by an optical system in the scatterometry apparatus. In a step 55, a detected waveform is obtained, and then, in a step 56, the calculated waveforms in the library created in the step 53 and the detected waveform obtained in the step 55 are compared. In a step 57, a calculated waveform having the highest degree of coincidence to the detected waveform is selected as a best-match calculated waveform.

In a step 58, line widths d1 and d2, a pattern height h1, film thicknesses h2 and h3, and a sidewall angle θ of the object pattern are calculated from the selected best-match calculated waveform.

A major reason for generally using the CD-SEM measurement and the scatterometry measurement as mentioned above is that both of them can be used in an in-line measurement. Merits of the CD-SEM measurement and the scatterometry measurement are such that an early cause investigation can be made when any abnormality is detected in the measurement in the CD-SEM because the CD-SEM can directly observe product patterns, and the object pattern can be measured at a high throughput in the scatterometry because it uses light in the measurement and thus the measurement is implemented in the air pressure different from the CD-SEM.

However, a demerit of the CD-SEM measurement and the scatterometry measurement is that only plane information can be obtained when a contact hole is measured by CD-SEM as illustrated in FIG. 17, and thus it is difficult to obtain three-dimensional shape information. FIG. 17 is a diagram illustrating an example of a conventional measurement on a contact hole by CD-SEM.

In the scatterometry, a dedicated TEG (test element group: characteristics evaluation element) for the scatterometry measurement should be used as a test pattern at a scribing part of a product wafer, and thus there is a problem that, when an abnormality exists in the product pattern, the abnormality cannot be directly observed.

As a countermeasure of such problems, a method of obtaining three-dimensional shape information of the product pattern using a scatterometry measurement result based on the CD-SEM measurement is described in Japanese Patent Application Laid-Open Publication No. 2004-219343 (Patent Document 1).

In addition, to improve throughput, calculated waveforms are calculated by simulations with previously changing hundreds of thousands to millions of measurement parameters from a calculation model, and a library as illustrated in FIG. 18 is created in the scatterometry. Therefore, there is a problem of large preparation load until the scatterometry is used in the in-line measurement.

FIG. 18 is a diagram illustrating a library of calculated waveforms obtained by simulations from a conventional calculation model.

As a countermeasure to such a problem, Japanese Patent Application Laid-Open Publication (Translation of PCT Application) No. 2008-530519 (Patent Document 2) describes a method of introducing s simpler calculation of the simulation by previously creating a model of only a film, and estimating a prediction value from the film model, and using the value.

SUMMARY OF THE INVENTION

In addition to the problems mentioned above, there is a possibility in the conventional scatterometry measurement in the future as miniaturization of semiconductors advances that a feature value of each parameter is difficult to capture from spectral waveforms obtained from the object pattern, and thus the shape measurement of the pattern cannot be accurately performed.

For example, an example not satisfying the waveform coincidence conditions in the step 56 illustrated in FIG. 16 will be described below.

FIGS. 19 to 21 are explanatory diagrams describing examples of conventional pattern measurements incapable of achieving an accurate pattern shape measurement.

A size of an object sample is thicker or thinner than that of a reference sample 80 illustrated in FIG. 19 as a sample 90 illustrated in FIG. 20. A sidewall angle is changed to the reference sample in addition to the size change as a sample 100 illustrated in FIG. 21.

FIG. 22 illustrates an example of a result of calculation of spectral waveforms calculated by a simulation obtained when irradiating light onto an object pattern having a size of 70 nm and a pitch of 140 nm. FIG. 22 is a diagram illustrating a conventional simulation result of spectral waveforms.

In FIG. 22, as compared to an optimum pattern 112, a pattern 111 having a −10% thinner size and a pattern having a +10% thicker size have characteristic changes in the spectral waveforms. In addition, since these patterns can be distinguished from a pattern 110 having a changed sidewall angle of a taper angle of 1.6 degrees, changes in shape of each of the patterns can be measured.

Further, FIG. 23 illustrates an example of a result of calculation of spectral waveforms calculated by a simulation obtained when irradiating light onto an object pattern having a size of 35 nm and a pitch of 70 nm. FIG. 23 is a diagram illustrating spectral waveforms of a result of a conventional simulation.

In FIG. 23, with respect to an optimum pattern 122, each of a pattern 121 having a −10% thinner size and a pattern 123 having a +10% thicker size has changes in the spectral waveforms, and the patterns can be distinguished from each other.

However, since a sidewall angle is changed in the object pattern, a result is obtained that a pattern 120 having a taper angle of 1.6 degrees has the same waveform as that of the pattern 121 and it is difficult to distinguish. A reason is considered such that, in the scatterometry measurement, a refractive index change determined by a volume ratio between air and the pattern part is obtained from the spectral waveforms when the pitch is greatly smaller than a wavelength of the irradiated light, but since an amount of the change is very small, and it is difficult to capture features.

Even in consideration of a substitution by other measurement apparatuses, for example, to perform a measurement on contact holes in semiconductor device manufacture, it is important to accurately measure the size of the bottom of the hole, and the CD-SEM measurement is not suitable to this because it is difficult to perform a three-dimensional shape measurement. In addition, AFM (atomic force microscope) is currently impractical to use in the in-line measurement in view of the problems in reproducibility, throughput, etc.

In addition, since the process margin of semiconductor devices is in a trend of narrowing along with miniaturization, a highly accurate process control has been desired in the manufacture process of semiconductor devices, and it is one of the problems to be solved.

Accordingly, a preferred aim of the present invention is to solve these problems and to provide a pattern shape measurement method capable of performing a highly accurate pattern shape measurement of a semiconductor pattern even when the process margin is narrow with regard to miniaturization of semiconductor devices.

The above and other preferred aims and novel characteristics of the present invention will be apparent from the description of the present specification and the accompanying drawings.

The typical ones of the inventions disclosed in the present application will be briefly described as follows.

That is, a typical invention includes: a first step of performing a simulation with sequentially changing shape parameters of a calculation model, creating a library from a plurality of calculated waveforms obtained from the simulation, and storing the library in a database; a second step of irradiating light onto an object pattern of a semiconductor device to be measured and obtaining a detected waveform from reflected light or diffracted light of the irradiated light; a third step of performing a matching of the library stored in the database and the detected waveform and selecting a best-match calculated waveform; a fourth step of setting at least one parameter among the shape parameters as a fixed value based on information obtained by another measurement apparatus using a measurement method independent of the first to third steps, performing a matching of the library and the detected waveform again, and selecting a best-match calculated waveform when a best-match calculated waveform cannot be selected in the third step for selecting a best-match waveform; and a fifth step of obtaining shape information of the object pattern from the best-match calculated waveform.

The effects obtained by typical aspects of the present invention will be briefly described below.

That is, effects obtained by the typical invention are such that a pattern shape measurement of a miniaturized devices with a narrow margin can be achieved, and highly accurate process control can be achieved by obtaining optimum values of exposure conditions and etching conditions from obtained shape information and feeding back and/or feeding forward the optimum values to each process, and a yield can be improved.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
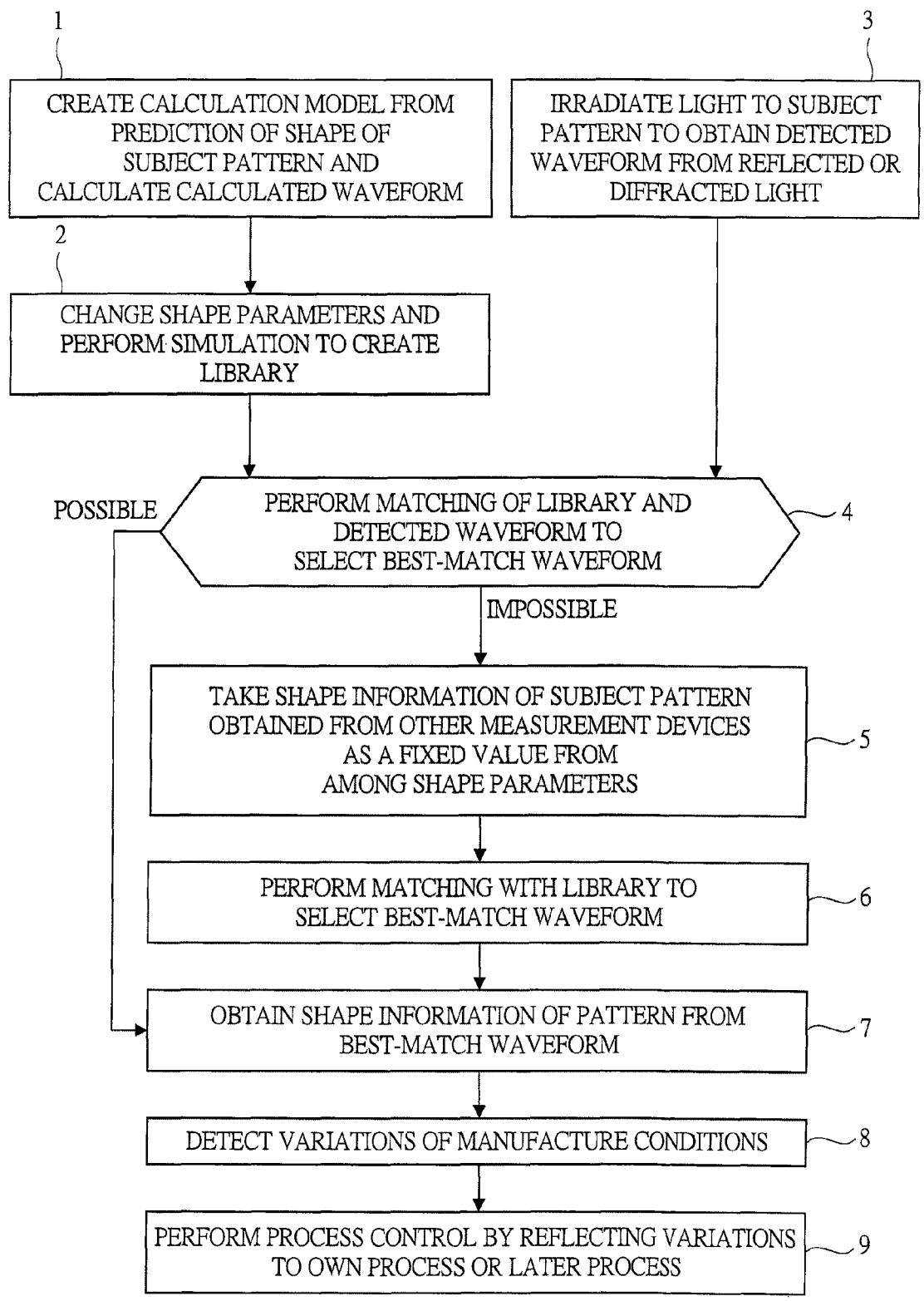
FIG. 1 is a flowchart illustrating an operation of a method of measuring a pattern shape and a method of manufacturing a semiconductor device according to a first embodiment of the present invention.
Figure 2:
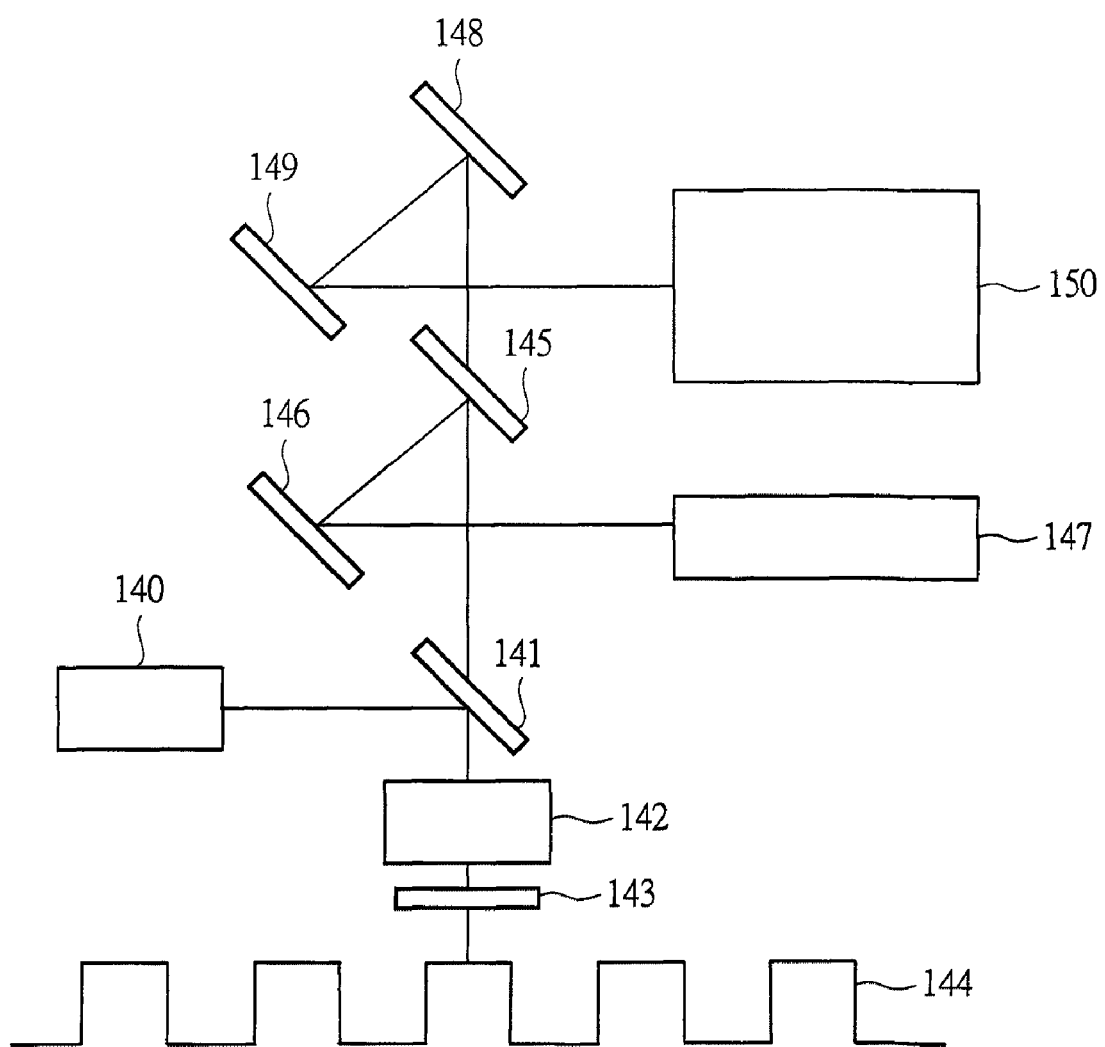
FIG. 2 is a diagram illustrating an example of an optical system for obtaining spectral waveforms by an optical interferometry in the method of measuring a pattern shape and the method of manufacturing a semiconductor device according to the first embodiment of the present invention.
Figure 3:
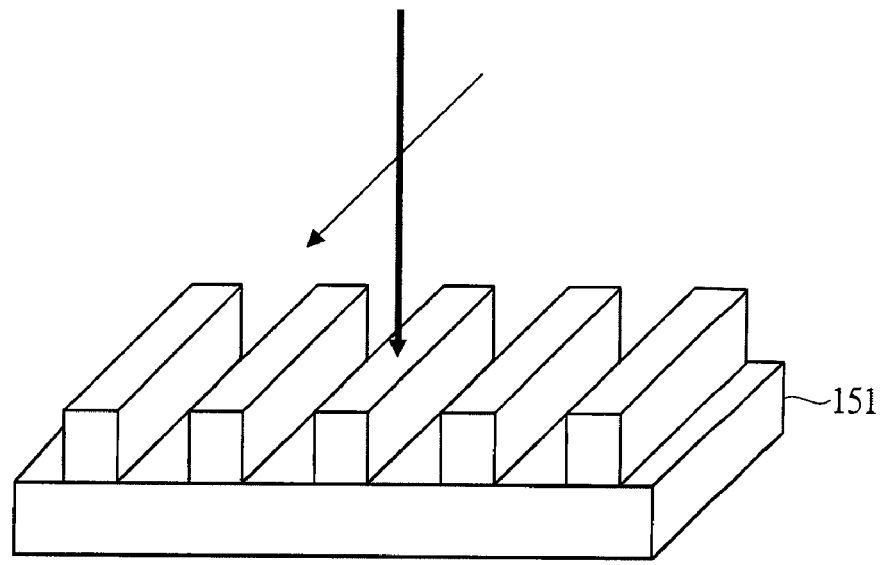
FIG. 3 is a diagram illustrating an example of a TE mode obtained when a polarized plate is rotated in the method of measuring a pattern shape and the method of manufacturing a semiconductor device according to the first embodiment of the present invention.
Figure 4:
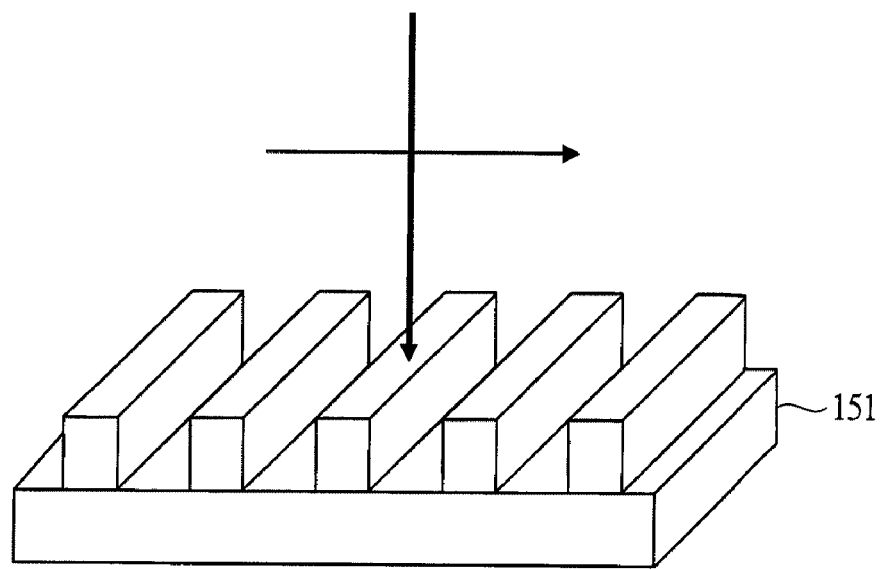
FIG. 4 is a diagram illustrating an example of a TM mode obtained when a polarized plate is rotated in the method of measuring a pattern shape and the method of manufacturing a semiconductor device according to the first embodiment of the present invention.
Figure 5:
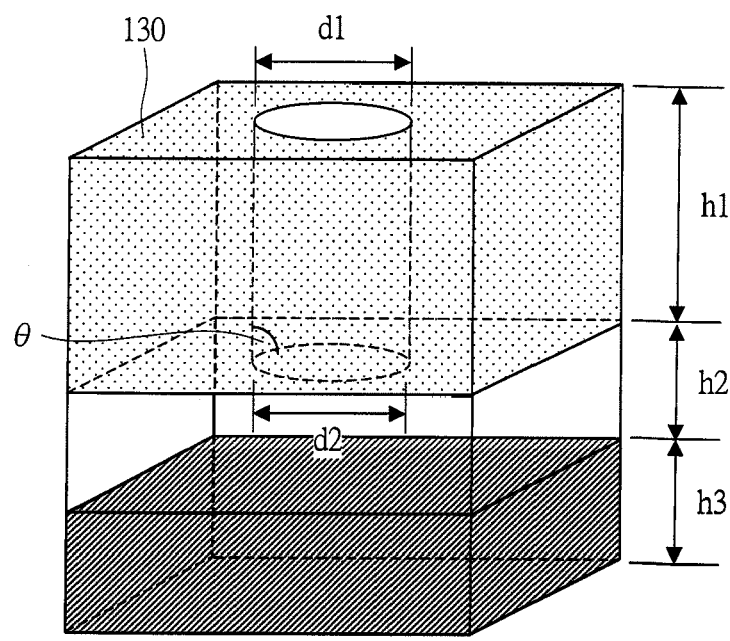
FIG. 5 is a diagram illustrating an example of a three-dimensional shape measurement model of a contact hole to be measured by scatterometry in the method of measuring a pattern shape and the method of manufacturing a semiconductor device according to the first embodiment of the present invention.
Figure 6:
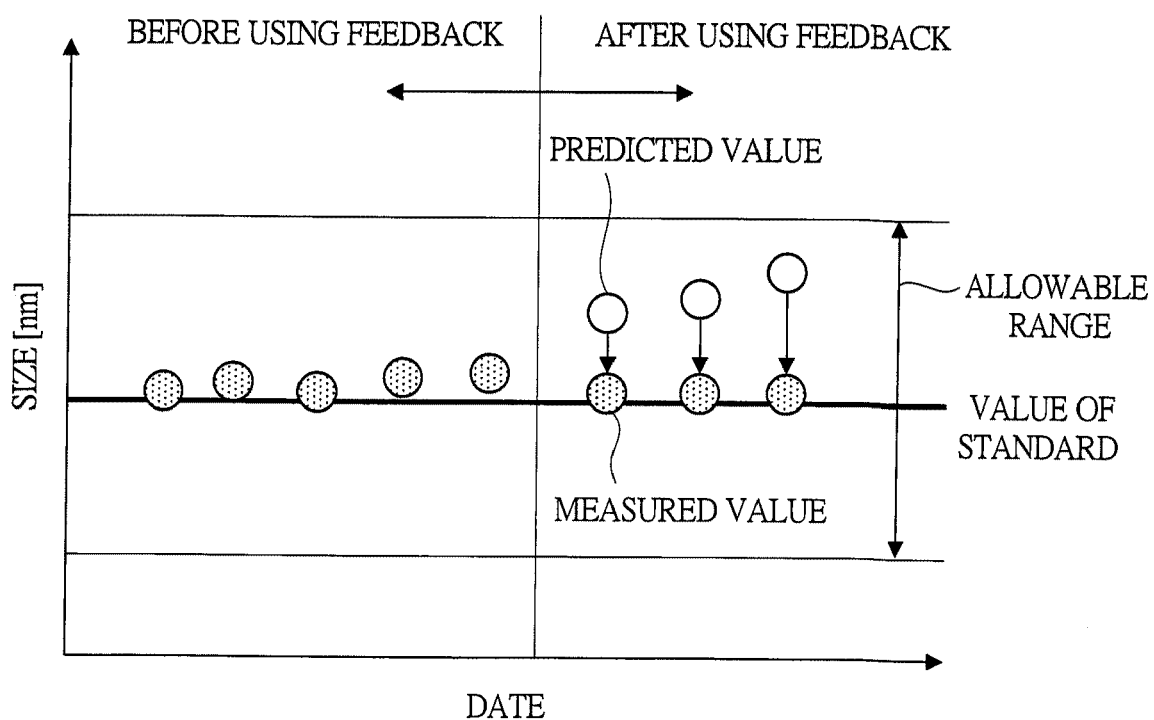
FIG. 6 is a diagram illustrating an example of variations in a pattern size depending on conditions of manufacture of a semiconductor device in the method of measuring a pattern shape and the method of manufacturing a semiconductor device according to the first embodiment of the present invention.

With reference to FIGS. 1 to 6, an operation of a method of measuring a pattern shape and a method of manufacturing a semiconductor device according to a first embodiment of the present invention will be described. FIG. 1 is a flowchart illustrating an operation of a method of measuring a pattern shape and a method of manufacturing a semiconductor device according to the first embodiment of the present invention. FIG. 2 is a diagram illustrating an example of an optical system for obtaining spectral waveforms by optical interferometry in the method of measuring a pattern shape and the method of manufacturing a semiconductor device according to the first embodiment of the present invention. FIG. 3 is a diagram illustrating an example of a TE mode obtained when a polarized plate is rotated in the method of measuring a pattern shape and the method of manufacturing a semiconductor device according to the first embodiment of the present invention. FIG. 4 is a diagram illustrating an example of a TM mode obtained when a polarized plate is rotated in the method of measuring a pattern shape and the method of manufacturing a semiconductor device according to the first embodiment of the present invention. FIG. 5 is a diagram illustrating an example of a three-dimensional shape measurement model of a contact hole to be measured by scatterometry in the method of measuring a pattern shape and the method of manufacturing a semiconductor device according to the first embodiment of the present invention. FIG. 6 is a diagram illustrating an example of variations in a pattern size depending on conditions of manufacture of a semiconductor device in the method of measuring a pattern shape and the method of manufacturing a semiconductor device according to the first embodiment of the present invention.

The present embodiment uses a scatterometry measurement in an in-line measurement in a semiconductor device manufacture.

With reference to FIG. 1, first, in a step 1, a shape of an object pattern of a semiconductor device to be measured is predicted from information such as property values (refractive index and absorption coefficient), shape, and/or base film thickness of the object pattern, a calculation model is created, and calculated waveforms are calculated from the created calculation model.

Figure 18:
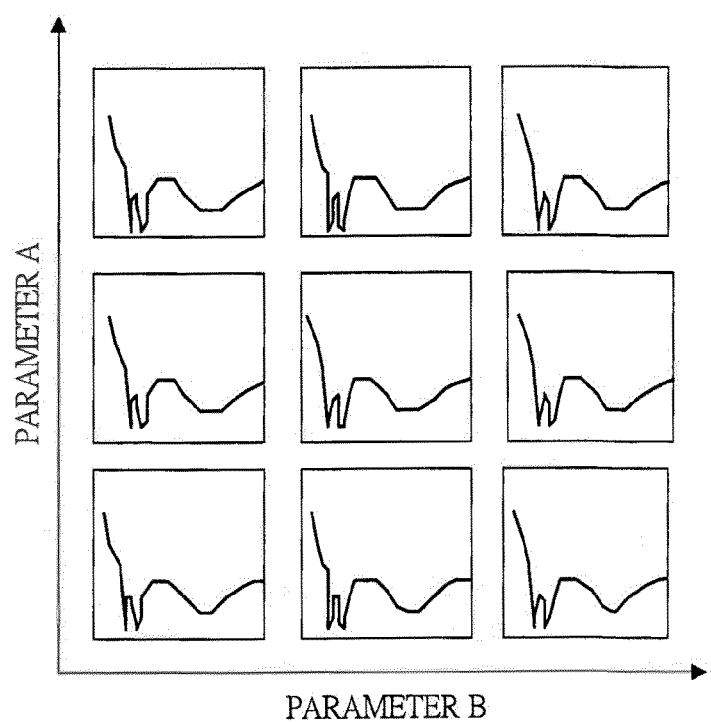
FIG. 18 is a diagram illustrating a library of calculated waveforms obtained by a simulation from a conventional calculation model.
Figure 19:
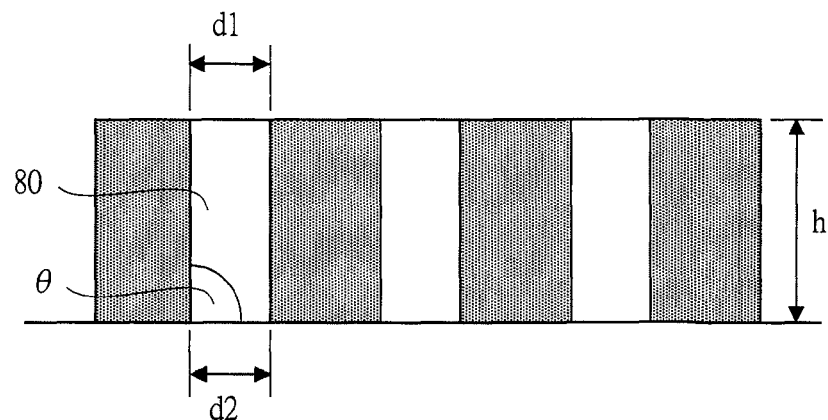
FIG. 19 is an explanatory diagram for describing an example incapable of accurately performing a shape measurement of a pattern in a conventional pattern measurement.
Figure 20:
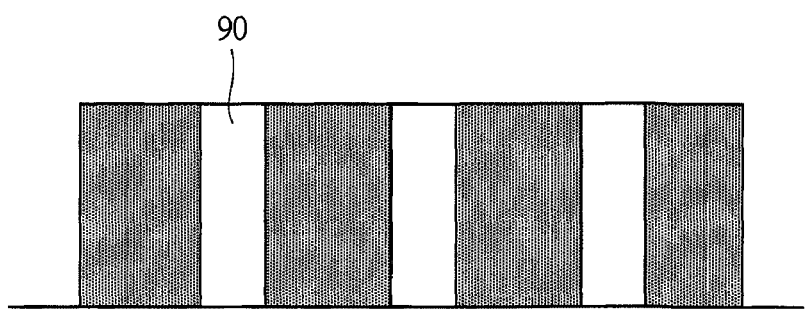
FIG. 20 is an explanatory diagram for describing an example incapable of accurately performing a shape measurement of a pattern in a conventional pattern measurement.
Figure 21:
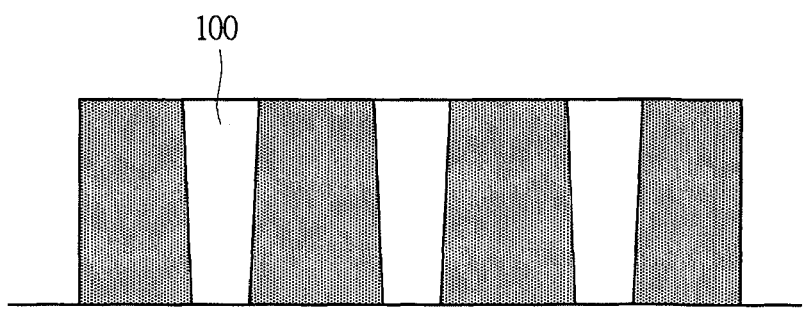
FIG. 21 is an explanatory diagram for describing an example incapable of accurately performing a shape measurement of a pattern in a conventional pattern measurement.
Figure 22:
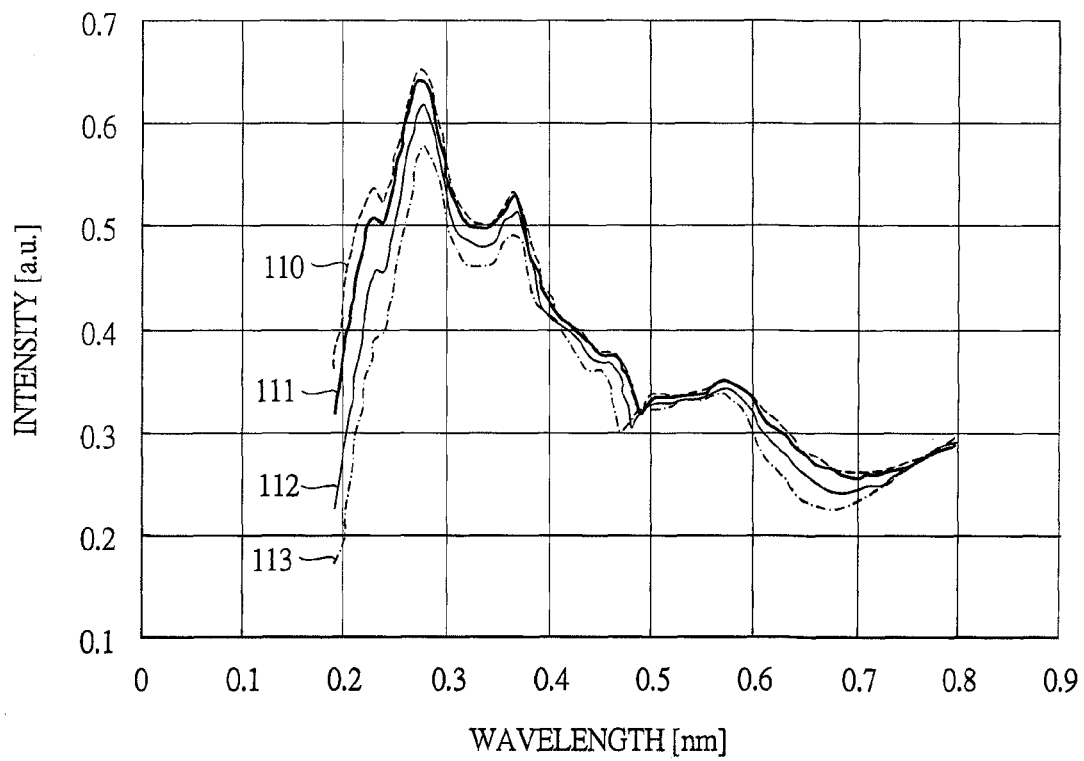
FIG. 22 is a diagram illustrating a result of a conventional simulation of spectral waveforms.
Figure 23:
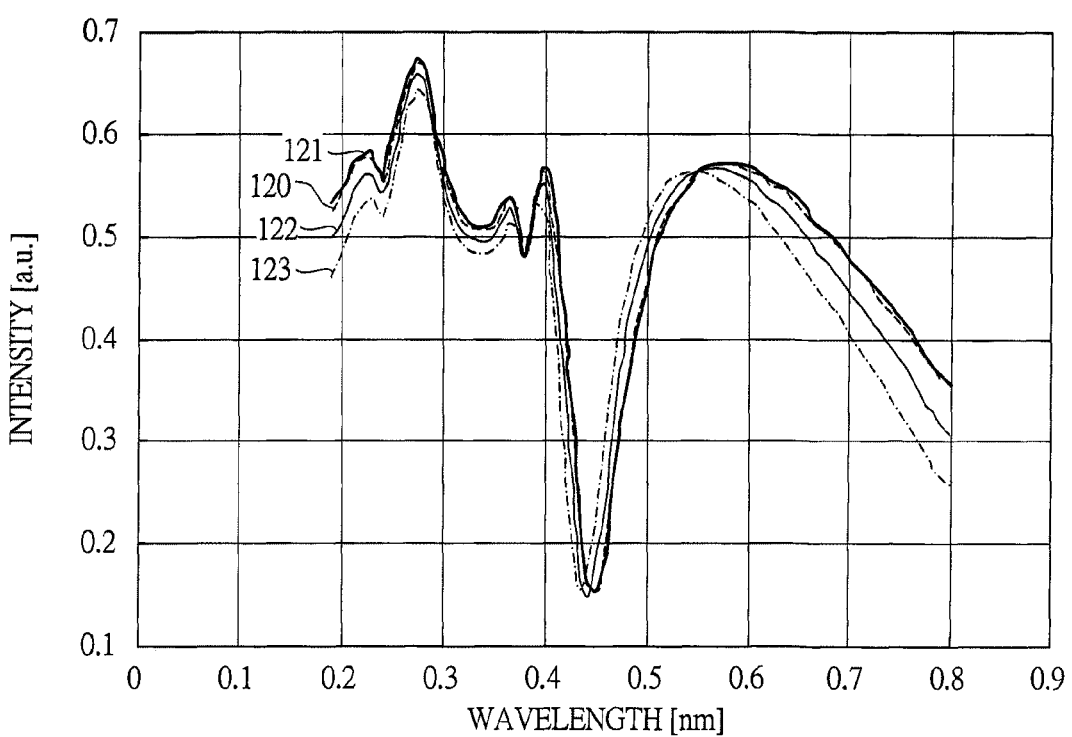
FIG. 23 is a diagram illustrating a result of a conventional simulation of spectral waveforms.

Next, in a step 2, calculated waveforms obtained when changing shape parameters are calculated by a simulation, and a library as illustrated in FIG. 18 is created based on obtained data.

Next, in a step 3, a detected waveform of the scatterometry is measured. The measurement of detected waveform is performed by optical interferometry in the optical system illustrated in FIG. 2.

In FIG. 2, first, white light 140 outputted from a light source is reflected at a beam splitter 141, passes an object lens 142 and a polarizing plate 143, and is irradiated onto a sample 144 of a semiconductor device to be measured. The light reflected or diffracted by the sample 144 reaches a reflection aperture 145, and part of the light is reflected on the reflection aperture 145 and inputted to an observation camera 147 via a mirror 146.

The light passed through the reflection aperture 145 is further separated by a diffraction grating 148, and detected by a detector 150 through a reflection by a mirror 149.

By rotating the polarizing plate 143, a TE (transverse electric wave) mode of components of the light parallel to an object pattern 151 illustrated in FIG. 3 and a TM (transverse magnetic wave) mode of components of the light perpendicular to the object pattern illustrated in FIG. 4 can be obtained.

This method is for increasing the amount of information by utilizing the TE and TM modes having different sensitivities with respect to changes in the pattern shape (line width, sidewall angle, height, skirt shape, rounded shape etc.) and for improving a measurement accuracy.

With reference to FIG. 1 again, next, in a step 4, a matching of the detected waveform and the library is performed and a best-match waveform is selected. Here, when a best-match waveform can be selected, a shape of the pattern is obtained in a step 7 from the obtained best-match waveform.

In addition, when a best-match waveform cannot be selected in the step 4, since a changed amount of the object pattern is minute and it is difficult to capture the changed amount by the single scatterometry, it is impossible to distinguish whether it is a change in size of the object pattern, or a change in shape/sidewall angle.

Thus, in a step 5, among the shape parameters, the size of the object pattern is measured by using CD-SEM that is another measurement apparatus, and a value obtained here is taken as a fixed value. When a size value of the pattern is determined, a size change with respect to an optimum pattern or changes including a change in the sidewall angle can be distinguished, and thus, in a step 6, a best-match calculated waveform can be selected from the library, and the remaining shape information can be calculated in a step 7.

Examples of shape parameters obtained as a result of the above-described steps include three-dimensional shape information such as an upper-surface size d1, a bottom-surface size d2, a sidewall angle θ, thicknesses h1, h2 and h3 of the contact hole illustrated in FIG. 5. A cause of abnormality or failure is estimated from the obtained shape information, and a variation detection of manufacture conditions of the semiconductor device is performed in a step 8. For the variation detection, a semiconductor wafer manufactured with previously changed conditions is formed, pattern shape information with respect to the manufacture conditions is stored, and a correction to the manufacture apparatus is performed.

For example, in a lithography process, an FEM (focus exposure matrix) wafer formed with varying focus and exposure amount is previously formed. Then, a correlation between the manufacture conditions and pattern shape information obtained from reflected light or diffracted light from a pattern formed on the FEM wafer is obtained from a regression analysis, thereby detecting variations in the manufacture conditions such as focus and exposure amount. A result obtained here is fed back to the lithography process etc.

For example, as illustrated in FIG. 6, from the tendency of the object pattern size with respect to the previously stored exposure amount, a pattern size after an exposure process of a product to be manufactured next is predicted and an exposure amount correction is performed. As a result, a measured value after using the feedback has a smaller difference from a value of standard, thereby enabling stable product manufacture.

In addition, when the detected variations in the manufacture conditions are fed forward to an etching process, based on pattern information obtained after the exposure process, for example, a processing time is adjusted to be long when the pattern after the exposure process is thicker than a value of standard so that the pattern becomes optimum after the etching process to control the whole of the process.

Moreover, when the detected variations in the manufacture conditions are fed back to the etching process, a wafer formed with varying manufacture conditions such as a flow rate, pressure, and/or temperature of gas is previously formed, and a correlation between the manufacture conditions and pattern shape information obtained from reflected light or diffracted light from a pattern formed on the wafer is obtained, so that the manufacture conditions such as a flow rate, pressure, and/or temperature of gas are detected. An obtained result is fed back to the etching process to control the whole of the process.

Note that, while an example of using CD-SEM as another measurement apparatus has been described in the present embodiment, a film thickness monitor or AFM may be used.

Second Embodiment

Figure 7:
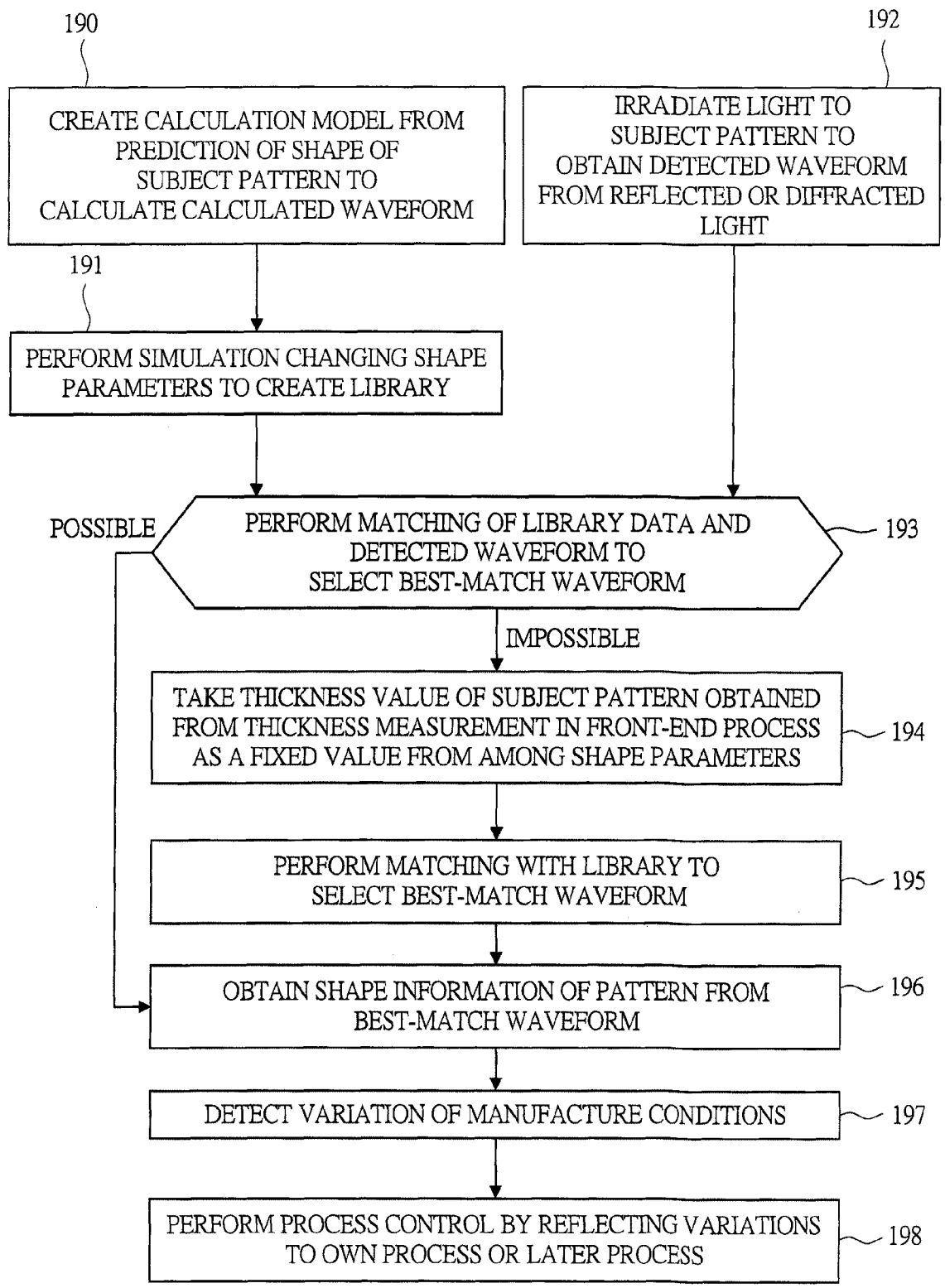
FIG. 7 is a flowchart illustrating an operation of a method of measuring a pattern shape and a method of manufacturing a semiconductor device according to a second embodiment of the present invention.
Figure 8:
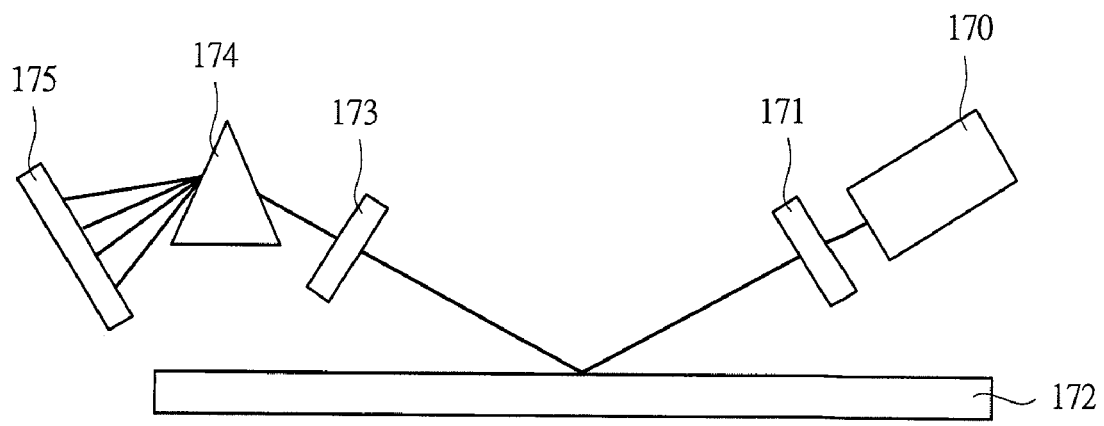
FIG. 8 is a diagram illustrating an example of an optical system for obtaining spectral waveforms by spectral ellipsometry in the method of measuring a pattern shape and the method of manufacturing a semiconductor device according to the second embodiment of the present invention.

Next, with reference to FIGS. 7 and 8, a method of measuring a pattern shape and a method of manufacturing a semiconductor device according to a second embodiment of the present invention will be described. FIG. 7 is a flowchart illustrating an operation of a method of measuring a pattern shape and a method of manufacturing a semiconductor device according to the second embodiment of the present invention. FIG. 8 is a diagram illustrating an example of an optical system for obtaining spectral waveforms by spectral ellipsometry in the method of measuring a pattern shape and the method of manufacturing a semiconductor device according to the second embodiment of the present invention.

The present embodiment uses a scatterometry measurement in an in-line measurement in a semiconductor device manufacture.

With reference to FIG. 7, first, in a step 190, a shape of an object pattern of a semiconductor device to be measured is predicted from information such as property values (refractive index, absorption coefficient), shape, and/or base film thickness of the object pattern, a calculation model is created, and calculated waveforms are calculated from the created calculation model.

Next, in a step 191, calculated waveforms obtained when changing shape parameters are calculated by a simulation, and a library as illustrated in FIG. 18 is created based on obtained data.

Next, in a step 192, a detected waveform of the scatterometry is measured. The measurement of detected waveform is performed by optical interferometry in the optical system illustrated in FIG. 2. First, white light 140 outputted from a light source is reflected at a beam splitter 141, passes an object lens 142 and a polarizing plate 143, and is irradiated onto a sample 144 of a semiconductor device to be measured. The light reflected or diffracted by the sample 144 reaches a reflection aperture 145, and part of the light is reflected on the reflection aperture 145 and inputted to an observation camera 147 via a mirror 146. The light passed through the reflection aperture 145 is separated by a diffraction grating 148, and detected by a detector 150 through a reflection by a mirror 149.

By rotating the polarizing plate 143, a TE (transverse electric wave) mode of components of the light parallel to an object pattern 151 illustrated in FIG. 3 and a TM (transverse magnetic wave) mode of components of the light perpendicular to the object pattern illustrated in FIG. 4 can be obtained. This method is for increasing the amount of information by utilizing the TE and TM modes having different sensitivities with respect to changes in the pattern shape (line width, sidewall angle, height, skirt shape, rounded shape etc.) and improving a measurement accuracy.

Next, in a step 193, a matching of the detected waveform and the library is performed and a best-match waveform is selected. Here, when a best-match waveform can be selected, a shape of the pattern is obtained in a step 196 from the best-match obtained waveform.

In addition, when a best-match waveform cannot be selected in the step 193, since a changed amount of the object pattern is minute and it is difficult to capture the changed amount by the single scatterometry, it is impossible to distinguish whether it is a change in size of the object pattern, or a change in shape/sidewall angle.

Thus, in a step 194, a film thickness value obtained in a thickness monitor measurement using spectral ellipsometry in an earlier process is set as a fixed value among the shape parameters.

Here, a measurement principle of the spectral ellipsometry will be explained with reference to FIG. 8. First, a rotation angle of a polarizer 171 is set so that light outputted from a light source 170 passes the polarizer 171 and become a linear polarized light along a transmitted light axis. The light passed through the polarizer 171 is irradiated onto a sample 172, and reflected/diffracted light passes an analyzer 173 and subjected to a frequency decomposition by a prism 174, and then detected by a detector 175.

The analyzer 173 is rotated upon measurement, and from a change in the polarization states of the light before and after the irradiation onto the sample 172, $\Delta$ and $\psi$ are obtained as ellipso-parameters ($\Delta$ and $\psi$ denote a phase difference $\Delta$ and a amplitude ratio $\psi$ of p and s polarization states, respectively), thereby enabling a calculation of a measured thickness value from the obtained $\Delta$ and $\psi$.

Examples of shape parameters obtained as a result of the above-described steps include three-dimensional shape information such as an upper-surface size d1, a bottom-surface size d2, a sidewall angle $\theta$, thicknesses h1, h2 and h3 of the contact hole illustrated in FIG. 5. A cause of abnormality or failure is estimated from the obtained shape information, and a variation detection of manufacture conditions of the semiconductor device is performed in a step 197. For the variation detection, a semiconductor wafer manufactured with previously changed conditions is formed, and pattern shape information with respect to the manufacture condition is stored, and a correction to the manufacture apparatus is performed.

For example, in a lithography process, an FEM wafer formed with changing focus and/or exposure amount is previously formed. Then, by obtaining a correlation between manufacture conditions and pattern shape information obtained from reflected light or diffracted light from a pattern formed on the FEM wafer by regression analysis, variations in manufacture conditions such as focus and/or exposure amount can be detected.

A result obtained here is fed back to a lithography process etc. in a step 198, and, for example, as illustrated in FIG. 6, from a tendency of the size of the object pattern with respect to the previously stored exposure amount, a pattern size after an exposure process of a product to be manufactured next is predicted, and an exposure amount correction is performed.

As a result, a measured value after using the feedback has a smaller difference from a value of standard, thereby enabling stable product manufacture. In addition, when the detected variations in the manufacture conditions are fed forward to an etching process, based on pattern information obtained after the exposure process, a processing time is adjusted to be long for example when the pattern after the exposure process is thicker than a value of standard so that the pattern becomes optimum after the etching process to control the whole of the process.

Moreover, when the detected variations in the manufacture conditions are fed back to the etching process, a wafer formed with varying manufacture conditions such as a flow rate, pressure, and/or temperature of gas is previously formed, and a correlation between the manufacture conditions and pattern shape information obtained from reflected light or diffracted light from a pattern formed on the wafer is obtained, so that the manufacture conditions such as a flow rate, pressure, and/or temperature of gas are detected.

A result obtained here is fed back to the etching process to control the whole of the process.

Third Embodiment

Figure 9:
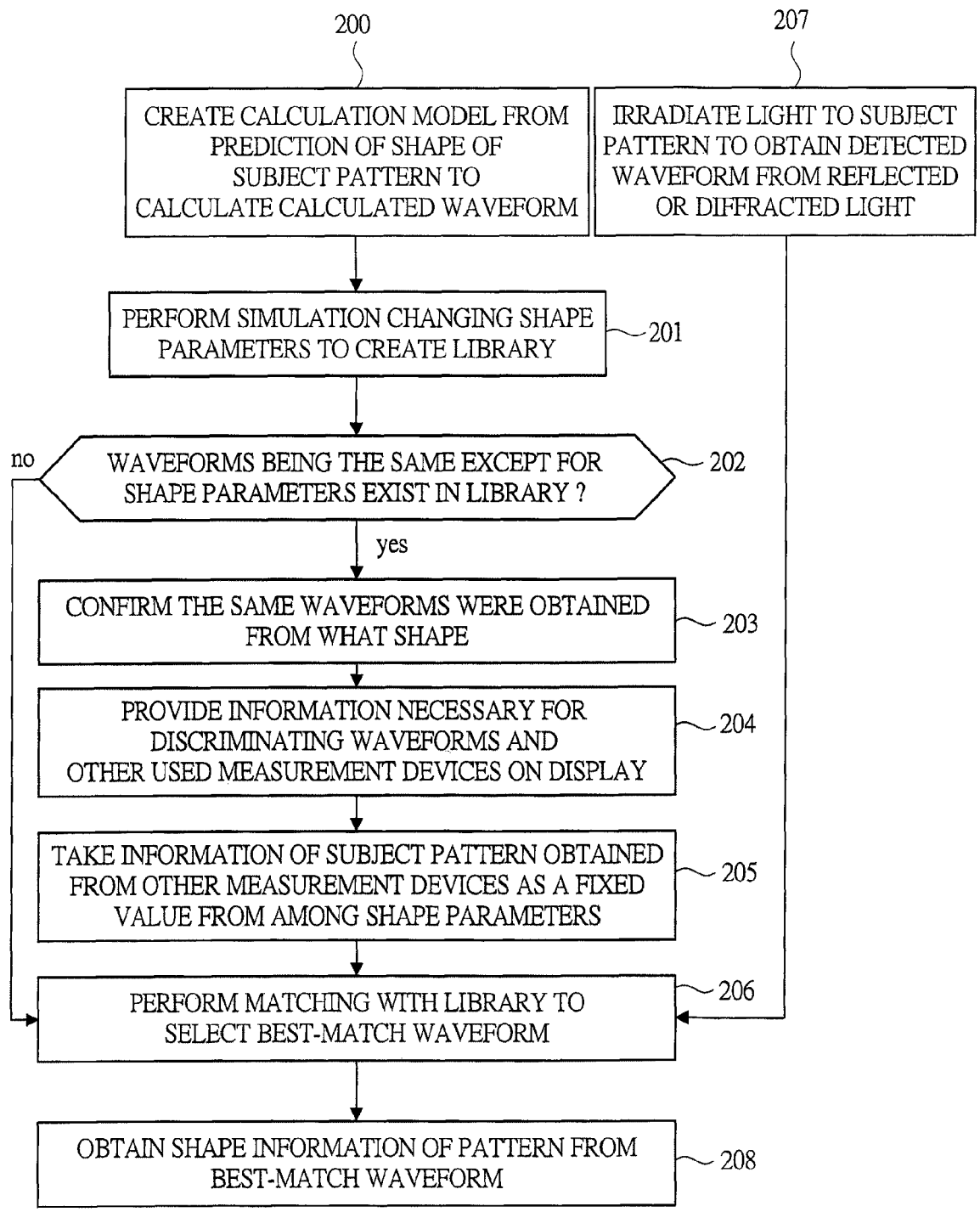
FIG. 9 is a flowchart illustrating an operation of a method of measuring a pattern shape and a method of manufacturing a semiconductor device according to a third embodiment of the present invention.

Next, with reference to FIG. 9, a method of measuring a pattern shape and a method of manufacturing a semiconductor device according to a third embodiment will be described. FIG. 9 is a flowchart illustrating an operation of a method of measuring a pattern shape and a method of manufacturing a semiconductor device according to the third embodiment of the present invention.

The present embodiment uses a scatterometry measurement in an in-line measurement in a semiconductor device manufacture.

With reference to FIG. 9, first, in a step 200, a shape of an object pattern of a semiconductor device to be measured is predicted from information such as property values (refractive index, absorption coefficient), shape, and/or base film thickness of the object pattern, a calculation model is created, and calculated waveforms are calculated from the created calculation model.

Next, in a step 201, calculated waveforms when changing shape parameters are calculated by a simulation, and a library as illustrated in FIG. 18 is created based on obtained data. Then, in a step 202, a determination on whether waveforms being the same except for shape parameters exist or not.

When such waveforms do not exist, in a step 206, a matching between the library and a detected waveform obtained from reflected light or diffracted light of light irradiated onto an object pattern by scatterometry in a step 207 is performed, and a best-match waveform is selected. In a step 208, shape information of the pattern is obtained from the best-match waveform.

Here, the waveform detection by the scatterometry in the step 207 will be described. The measurement of detected waveform is performed by optical interferometry in the optical system illustrated in FIG. 2. First, white light 140 outputted from a light source is reflected at a beam splitter 141, passes an object lens 142 and a polarizing plate 142, and is irradiated onto a sample 144 of a semiconductor device to be measured. The light reflected or diffracted by the sample 144 reaches a reflection aperture 145, and part of the light is reflected on the reflection aperture 145 and inputted to an observation camera 147 via a mirror 146. The light passed through the reflection aperture 145 is separated by a diffraction grating 148, and detected by a detector 150 through a reflection by a mirror 149.

By rotating the polarizing plate 143, a TE (transverse electric wave) mode of components of the light parallel to an object pattern 151 illustrated in FIG. 3 and a TM (transverse magnetic wave) mode of components of the light perpendicular to the object pattern illustrated in FIG. 4 can be obtained. This method is for increasing the amount of information by utilizing the TE and TM modes having different sensitivities with respect to changes in the pattern shape (line width, sidewall angle, height, skirt shape, rounded shape etc.) and improving a measurement accuracy.

In a step 202, when calculated waveforms being the same except for shape parameters exist in the library, a changed amount of the object pattern is minute and it is thus difficult to capture by the single scatterometry with regard to the calculated waveform, and thus it is impossible to distinguish between a change in size of the object pattern or a change in shape/sidewall angle.

Thus, in a step 203, what kind of shape the same waveforms are obtained from is confirmed, and in a step 204, information necessary for waveform determination and another measurement apparatus to be used are suggested on a display or the like.

Next, information of the object pattern obtained by the another measurement apparatus suggested in the step 204 is set as a fixed value. In the step 206, a matching between the library and the detected waveform obtained from reflected light or diffracted light of light irradiated on the object pattern by the scatterometry in the step 207 is performed, and a best-match waveform is selected. In the step 208, pattern shape information is obtained from the best-match waveform.

In the present invention, when waveforms being the same except for shape parameters exist among the calculated waveforms previously registered in the library, the object pattern is measured by another measurement apparatus, and information of the object pattern measured by the another measurement apparatus is set as a fixed value, and thus a best-match waveform can be certainly selected.

Fourth Embodiment

Figure 10:
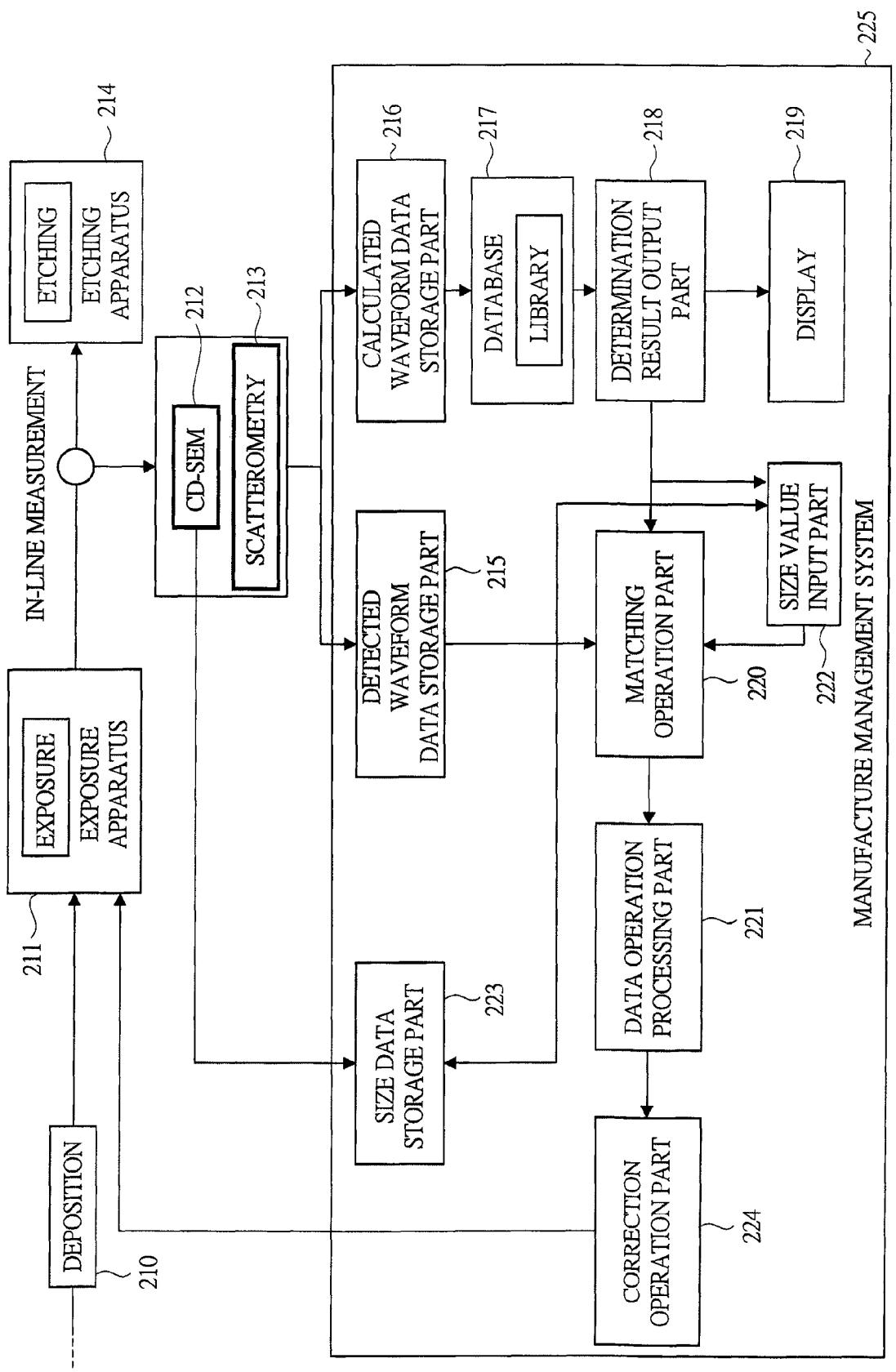
FIG. 10 is a diagram illustrating a configuration of a process control system to which a method of measuring a pattern shape according to a fourth embodiment is used.

Next, with reference to FIG. 10, a process control system to which a method of measuring a pattern shape according to a fourth embodiment is used will be described. FIG. 10 is a diagram illustrating a configuration of a process control system to which a method of measuring a pattern shape according to the fourth embodiment is applied.

In FIG. 10, the process control system includes: a deposition 210; a CD-SEM 212 which performs an in-line measurement after an exposure apparatus 211; a scatterometry 213; and a manufacture management system 225. The manufacture management system 225 includes: a detected waveform data storage part 215; a calculated waveform data storage part 216; a database 217; a determination result output part 218; a display 219; a matching operation part 220; a data operation processing part 221, a size value input part 222; a size data storage part 223; and a correction operation part 224.

Figure 11:
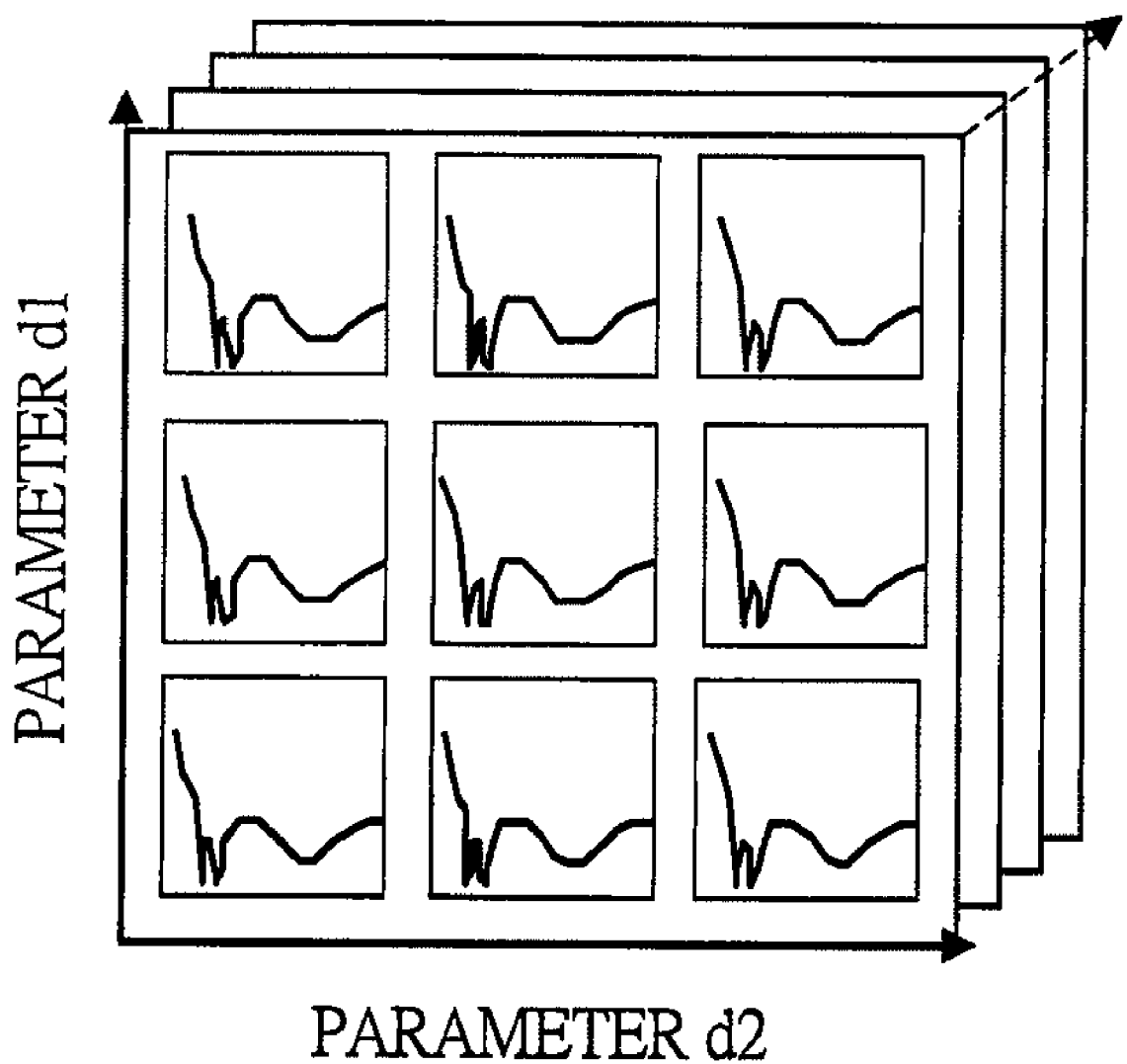
FIG. 11 is a diagram illustrating an example of a library of calculated waveforms used in the process control system to which the method of measuring a pattern shape according to the fourth embodiment is used.
Figure 12:
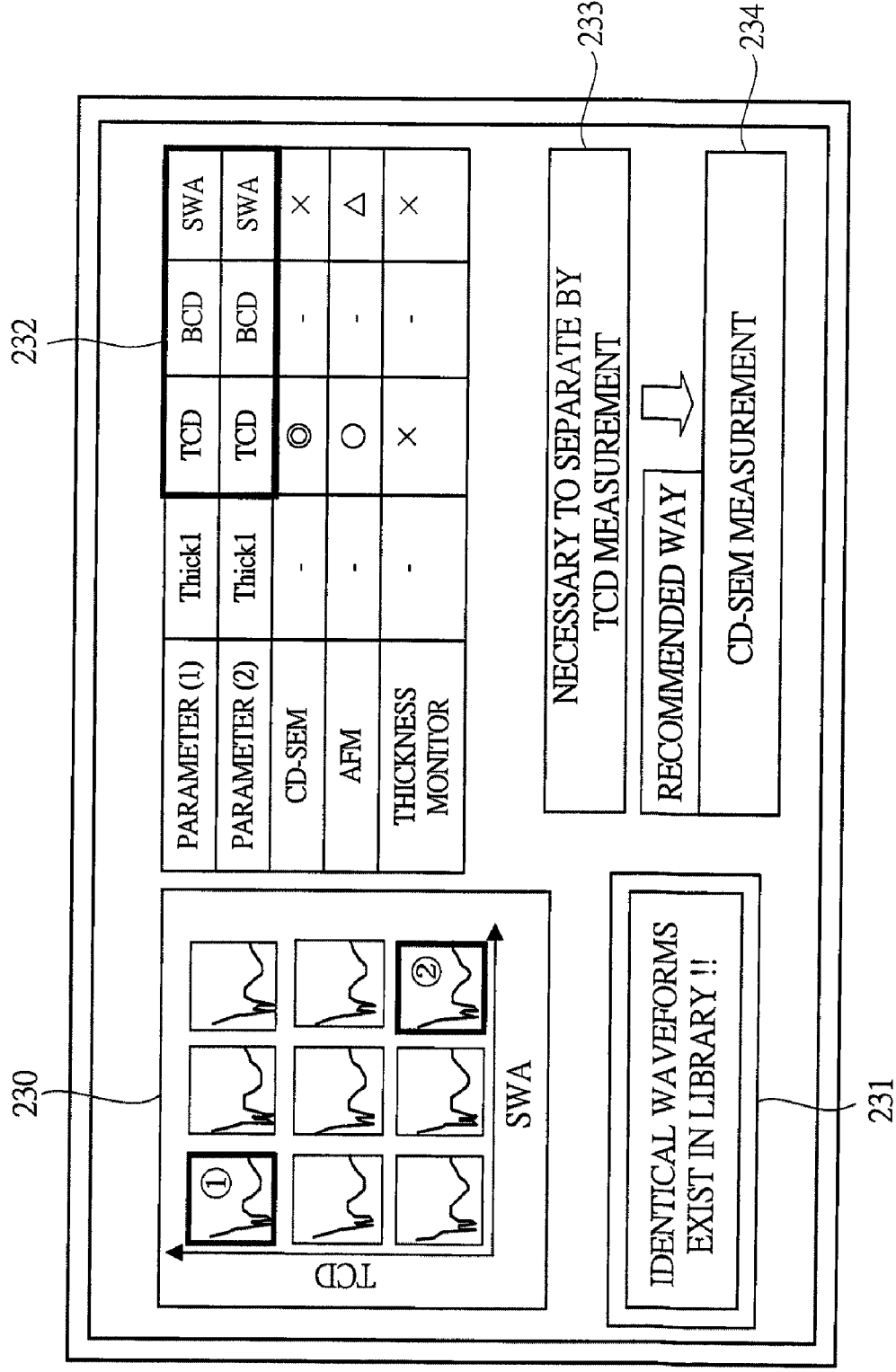
FIG. 12 is a diagram illustrating an example of a screen on a display of the process control system to which the method of measuring a pattern shape according to the fourth embodiment is used.
Figure 13:
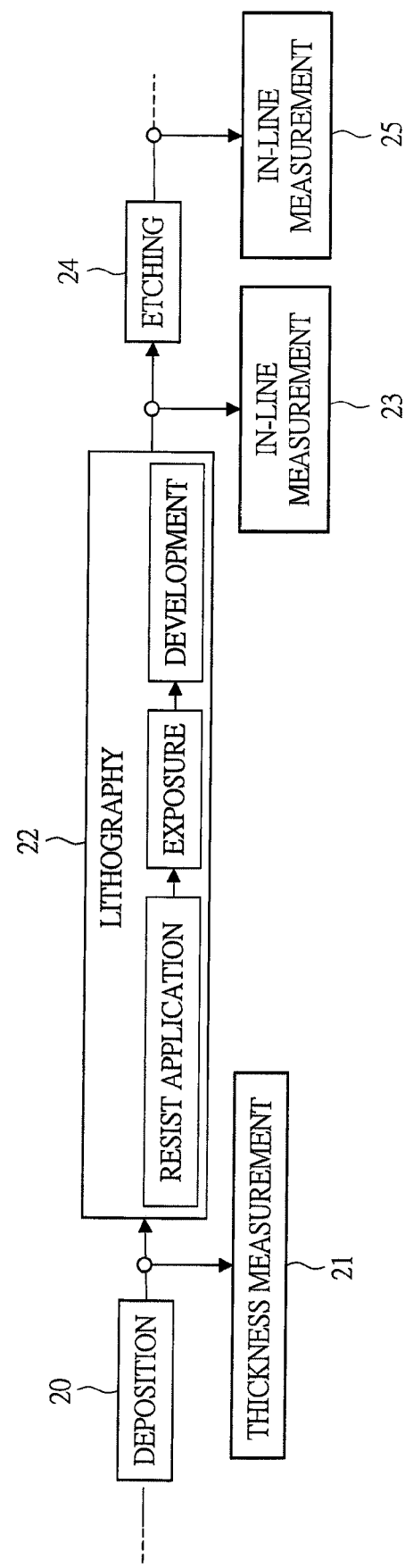
FIG. 13 is a diagram illustrating an example of a process to which a pattern measurement is used in a conventional semiconductor device manufacture.
Figure 14:
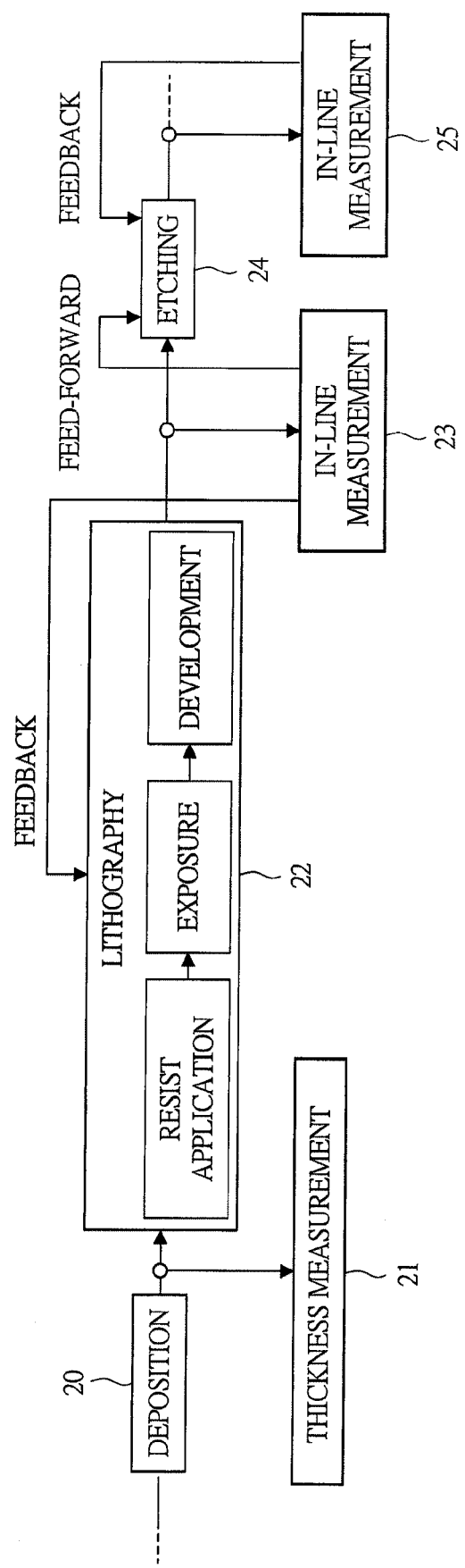
FIG. 14 is a diagram illustrating an example of a process to which a pattern measurement is used in a conventional semiconductor device manufacture.
Figure 15A:
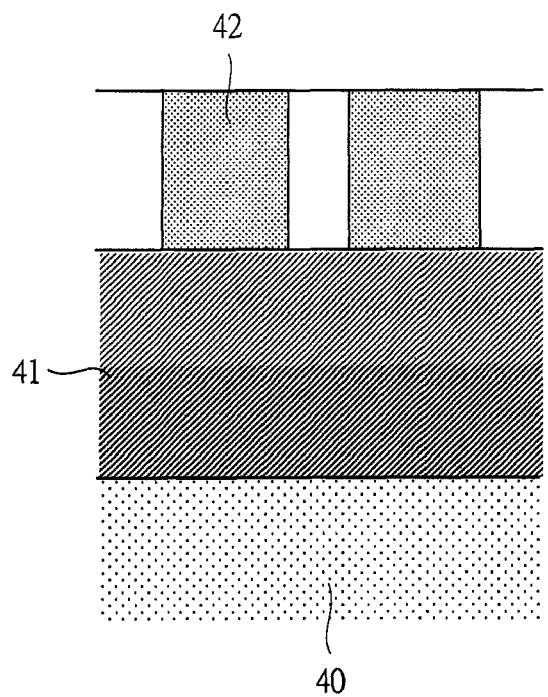
FIG. 15A is a diagram illustrating a cross-sectional view of a wafer in a conventional contact hole formation process and a process flow thereof.
Figure 15B:
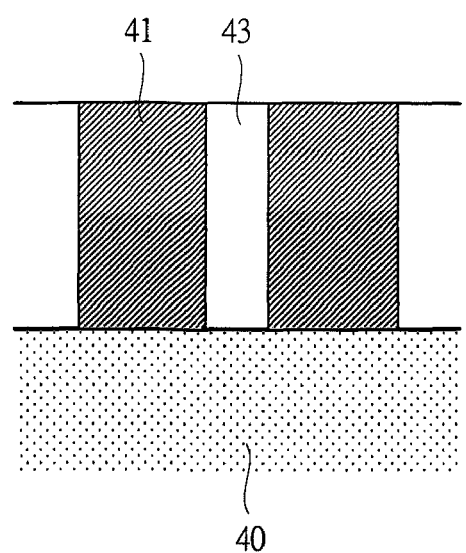
FIG. 15B is a diagram illustrating a cross-sectional view of the wafer in the conventional contact hole formation process and the process flow thereof.
Figure 16:
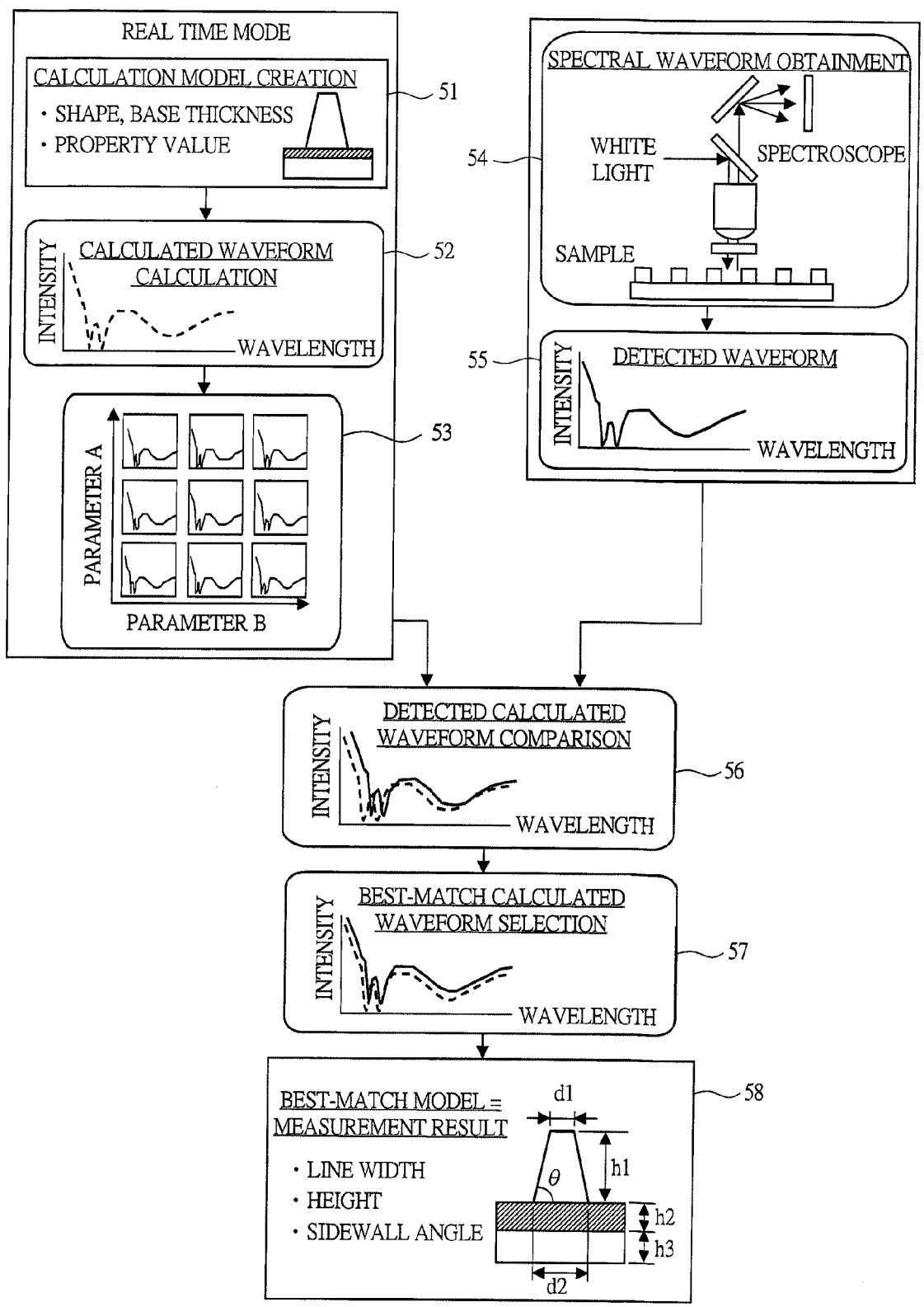
FIG. 16 is a diagram illustrating a conventional measurement principle of scatterometry.
Figure 17:
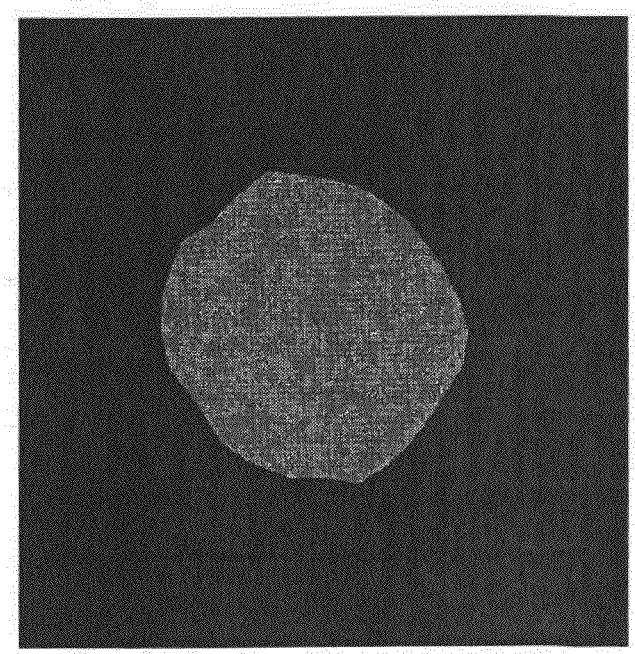
FIG. 17 is a diagram illustrating an example of a conventional measurement on a contact hole by CD-SEM.

Next, with reference to FIGS. 10 to 12, an operation of the process control system to which the method of measuring a pattern shape according to the fourth embodiment of the present invention will be described. FIG. 11 is a diagram illustrating an example of a library of calculated waveforms used in the process control system to which the method of measuring a pattern shape according to the fourth embodiment is used. FIG. 12 is a diagram illustrating an example of a screen on a display of the process control system to which the method of measuring a pattern shape according to the fourth embodiment is applied.

The present embodiment uses scatterometry in an in-line measurement in a semiconductor device manufacture.

With reference to FIG. 10, one process of a semiconductor device manufacture flow will be described. An oxide film and/or a metal film is formed on a semiconductor wafer in a process of the deposition 210. Thereafter, in a resist application process in a lithography process, a photosensitive resin is applied, and light is irradiated on the semiconductor wafer through a mask by an exposure apparatus 211 in an exposure process.

Thereafter, in a development process, part of the resist irradiated with the light is melted by a development solution when the resist is positive type, and part of the resist irradiated with the light remains when the resist is negative type, thereby forming a resist pattern. When the lithography process is finished, in an in-line measurement, measurement of size values of the object pattern of the semiconductor device to be measured by the CD-SEM 212 and a measurement of shape of the object pattern by the scatterometry 213 are performed. Then, in an etching process, unnecessary part of thin films is removed by an etching apparatus 214.

First, by a measurement by the scatterometry 213, a shape of an object pattern of a semiconductor device to be measured is predicted from information such as property values (refractive index, absorption coefficient), shape, and/or base film thickness of the object pattern, a calculation model is created, and calculated waveforms calculated from the created calculation model are stored in the calculated waveform data storage part 216.

Next, calculated waveforms obtained upon changing shape parameters are calculated by a simulation, and a library as illustrated in FIG. 11 is created based on obtained data and stored in the database 217. Thereafter, whether waveforms being the same except for shape parameters exist or not is determined, a result is outputted to the determination result output part 218, and the determination result is displayed on the display 219.

Here, when the same waveforms do not exist in the library, a matching of the library and a detected waveform, the detected waveform being obtained from reflected light or diffracted light of light irradiated onto the object pattern of the semiconductor device to be measured and being retrieved from the detected waveform data storage part 215, and a best-match calculated waveform is selected.

Next, shape information of the pattern is obtained from the best-match calculated waveform, and remaining shape parameters are calculated by the data processing part 221.

When waveforms being the same except for shape parameters exist in the library, since a change amount of the object pattern of the semiconductor device to be measured is minute and thus is difficult to be captured by the single scatterometry 213, it is impossible to distinguish between a change in size of the object pattern or a change in shape/sidewall angle. Thus, for example, as illustrated in FIG. 12, information necessary for waveform distinction and another measurement apparatus to be used are suggested on the display 219.

Then, at the size value input part 222, a size value of the object pattern obtained by the CD-SEM 212 that is the another measurement apparatus is retrieved from the size data storage part 223 among the shape parameters of the object pattern displayed on the display 219, and the size value is taken as a fixed value.

Thereafter, a matching of the calculated waveform in the library of the database 217 and the detected waveform in the detected waveform data storage part 215 is performed by the matching operation part 220, and a best-match calculated waveform is calculated. Further, shape information of the pattern is obtained from the best-match calculated waveform by the data operation processing part 221.

Shape parameters obtained as a result of the above-described steps include three-dimensional shape information such as an upper surface size d1, a bottom surface size d2, a sidewall angle θ, and film thicknesses h1, h2, and h3.

A cause of abnormality/failure of the object pattern is estimated from the obtained shape information, and a variation detection of the manufacture conditions of the semiconductor device is performed. For the variation detection, a semiconductor wafer is formed with previously changing manufacture conditions, and pattern shape information with respect to the manufacture conditions is stored, and a correction to the manufacture apparatus is performed.

For example, in a lithography process, an FEM wafer is formed with previously varying focus and an exposure amount. And, a correlation of the manufacture conditions and pattern shape information obtained from reflected light or diffracted light from a pattern formed on the FEM wafer is obtained by a regression analysis, thereby detecting variations in the manufacture conditions such as focus/exposure amount.

From the result obtained here, a setting value of the exposure apparatus 211 is calculated at the correction operation part 224 if needed and fed back to the exposure apparatus 211. And, for example, as illustrated in FIG. 6, from a tendency of the size of the object pattern with respect to an exposure amount previously stored, a pattern size after an exposure process of a product to be manufactured next is predicted, and a correction of the exposure amount is performed. As a result, a measured value after using the feedback has a smaller difference from a value of standard, and thus a stable product manufacture is achieved.

In addition, when the setting value of the exposure apparatus 211 is fed forward to an etching process, based on the pattern shape information obtained after the exposure process, for example, when the pattern after the exposure process is thicker than a value of standard, a processing time in the etching process is adjusted to be long so that the pattern becomes optimum after the etching process, and thus the whole of the process is controlled in this system.

Moreover, when the detected variations in the manufacture conditions are fed back to the etching process, a wafer is previously formed with varying manufacture conditions such as a flow rate, pressure, and/or temperature of gas, and a correlation between the manufacture conditions and pattern shape information obtained from reflected light or diffracted light from a pattern formed on the wafer is obtained, so that the manufacture conditions such as a flow rate, pressure, and/or temperature of gas are detected. An obtained result is fed back to the etching process to control the whole of the process in this system.

Note that, while an example of an operation of the process according to the third embodiment has been described in the present embodiment, an operation by the process according to the first embodiment or the second embodiment can similarly perform the pattern measurement.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention relates to a technology of manufacturing a semiconductor device, and is applicable to a system for performing a measurement on a pattern shape to be performed after an exposure process and/or an etching process by an in-line measurement.

What is claimed is:

1. A method of measuring a pattern shape of irradiating light onto an object pattern of a pattern-attached substrate and measuring a shape of the pattern on the pattern-attached substrate by a processing of an operation part based on reflected light or diffracted light of the irradiated light, the method comprising:
    a first step of creating a calculation model from a predicted shape of the object pattern on the pattern-attached substrate to be measured, and calculating calculated waveforms of reflected light or diffracted light obtained when irradiating light on the object pattern based on the calculation model;
    a second step of performing a simulation with sequentially changing shape parameters of the calculation model, creating a library from a plurality of calculated waveforms obtained from the simulation, and storing the library to a database;
    a third step of irradiating light onto the object pattern on the pattern-attached substrate to be measured, and obtaining a detected waveform from reflected light or diffracted light of the irradiated light;
    a fourth step of performing a matching of the library stored in the database and the detected waveform, and selecting a best-match calculated waveform;
    a fifth step of, when the best-match calculated waveform cannot be selected in the fourth step of selecting the best-match calculated waveform, setting at least one parameter among the shape parameters as a fixed value based on information obtained by another measurement apparatus that uses a measurement method independent to the first to fourth steps, performing the matching of the library and the detected waveform again, and selecting a best-match calculated waveform; and
    a sixth step of obtaining shape information of the object pattern from the best-match calculated waveform.

2. A method of measuring a pattern shape of irradiating light onto an object pattern of a pattern-attached substrate and measuring a shape of the pattern on the pattern-attached substrate by a processing of an operation part based on reflected light or diffracted light of the irradiated light, the method comprising:

a first step of creating a calculation model from a predicted shape of the object pattern on the pattern-attached substrate to be measured, and calculating calculated waveforms of reflected light or diffracted light obtained when irradiating light on the object pattern based on the calculation model;

a second step of performing a simulation with sequentially changing shape parameters of the calculation model, creating a library from a plurality of calculated waveforms obtained from the simulation, and storing the library to a database;

a third step of, when calculated waveforms being the same exist in the library, confirming what kind of shape the waveforms are obtained from, and suggesting information necessary for distinguishing waveforms of calculated waveforms and another measurement apparatus that should be used to obtain the information on a display;

a fourth step of retrieving information measured by the another measurement apparatus based on the information suggested on the display;

a fifth step of setting at least one parameter among the shape parameters as a fixed value based on the information obtained by the another measurement apparatus;

a sixth step of irradiating light onto the object pattern of the pattern-attached substrate to be measured and obtaining a detected waveform reflected light or diffracted light of the irradiated light;

a seventh step of performing a matching of the library stored in the database and the detected waveform, and selecting a best-math waveform; and an eighth step of obtaining shape information of the object pattern from the best-match calculated waveform.

3. The method of measuring a pattern shape according to claim 1, wherein
the measurement of the shape of the pattern on the pattern-attached substrate is an in-line measurement during manufacture of the pattern-attached substrate.

4. The method of measuring a pattern shape according to claim 1, wherein
the calculated waveform and the detected waveform are spectral waveforms obtained by a spectral apparatus or angle distribution waveforms obtained from a change of reflected light with respect to an incident angle.

5. The method of measuring a pattern shape according to claim 1, wherein
the step of obtaining the detected waveform performs a measurement using an optical interferometry measurement.

6. The method of measuring a pattern shape according to claim 1, wherein
the step of obtaining the detected waveform performs a measurement using a spectral ellipsometry measurement.

7. The method of measuring a pattern shape according to claim 1, wherein
the another measurement apparatus is any of CD-SEM, a thickness monitor, or an AFM.

8. A method of manufacturing a semiconductor device of irradiating light on an object pattern of a semiconductor device during manufacture of the semiconductor device, measuring a shape of the pattern on the semiconductor device by a processing of an operation part based on reflected light or diffracted light of the irradiated light, and performing a process control of the semiconductor device based on a result of the measurement, the method comprising:

a first step of creating a calculation model from a predicted shape of the object pattern of the semiconductor device to be measured and calculating calculated waveforms of reflected light or diffracted light obtained when irradiating light onto the object pattern based on the calculation model;

a second step of performing a simulation with sequentially changing shape parameters of the calculation model, creating a library from a plurality of calculated waveforms obtained from the simulation, and storing the library in the database;

a third step of irradiating light onto the object pattern of the semiconductor device to be measured, and obtaining a detected waveform from reflected light or diffracted light of the irradiated light;

a fourth step of performing a matching of the library stored in the database and the detected waveform, and selecting a best-match calculated waveform;

a fifth step of, when the best-match calculated waveform cannot be selected in the fourth step of selecting the best-match calculated waveform, setting at least one parameter among the shape parameters as a fixed value based on information obtained by another measurement apparatus that uses a measurement method independent to the first to fourth steps, performing the matching of the library and the detected waveform again, and selecting a best-match calculated waveform;

a sixth step of obtaining shape information of the object pattern from the best-match calculated waveform;

a seventh step of detecting variations in manufacture conditions from the obtained shape information; and an eighth step of reflecting detected information of the variations in manufacture conditions to a manufacture process of the semiconductor device.

9. A method of manufacturing a semiconductor device of irradiating light on an object pattern of a semiconductor device during manufacture of the semiconductor device, measuring a shape of the pattern on the semiconductor device by a processing of an operation part based on reflected light or diffracted light of the irradiated light, and performing process control of the semiconductor device based on a result of the measurement, the method comprising:

a first step of creating a calculation model from a predicted shape of the object pattern of the semiconductor device to be measured and calculating calculated waveforms of reflected light or diffracted light obtained when irradiating light onto the object pattern based on the calculation model;

a second step of performing a simulation with sequentially changing shape parameters of the calculation model, creating a library from a plurality of calculated waveforms obtained from the simulation, and storing the library in the database;

a third step of, when calculated waveforms being the same exist in the library, confirming what kind of shape the waveforms are obtained from, and suggesting information necessary for distinguishing waveforms of calculated waveforms and another measurement apparatus that should be used to obtain the information on a display;

a fourth step of retrieving information measured by the another measurement apparatus based on the information suggested on the display;

a fifth step of setting at least one parameter among the shape parameters as a fixed value based on the information obtained by the another measurement apparatus;

a sixth step of irradiating light onto the object pattern of the semiconductor device to be measured and obtaining a detected waveform from reflected light or diffracted light of the irradiated light;

a seventh step of performing a matching of the library stored in the database and the detected waveform, and selecting a best-math waveform;

an eighth step of obtaining shape information of the object pattern from the best-match calculated waveform;

a ninth step of detecting variations in manufacture conditions from the obtained shape information; and a tenth step of reflecting detected information of the variations in the manufacture conditions to a manufacture process of the semiconductor device.

10. The method of manufacturing a semiconductor device according to claim 8, wherein
a formation process of the object pattern of the semiconductor device to be measured includes an exposure process and an etching process.

11. The method of manufacturing a semiconductor device according to claim 10, wherein
the variations in the manufacture conditions include an exposure amount and a focus setting value in the exposure process.

12. The method of manufacturing a semiconductor device according to claim 11, wherein
the variations in the manufacture conditions are fed back to the exposure process.

13. The method of manufacturing a semiconductor device according to claim 10, wherein
the variations in the manufacture conditions include conditions of a flow rate, pressure, and temperature of a gas used in the etching process.

14. The method of manufacturing a semiconductor device according to claim 13, wherein
the variations in the manufacture conditions are fed back to the etching process.

15. The method of manufacturing a semiconductor device according to claim 10, wherein
the variations in the manufacture conditions are fed back to the exposure process, and fed back/forward to the etching process.

16. The method of manufacturing a semiconductor device according to claim 8, wherein
the variations in the manufacture conditions are detected by previously forming a wafer with varying the manufacture conditions, and obtaining a correlation between the manufacture conditions and shape information of the pattern obtained from reflected light or diffracted light from the pattern formed on the wafer.

17. A process control system irradiating light on an object pattern of a semiconductor device during manufacture of the semiconductor device, measuring a shape of the pattern on the semiconductor device by a processing of an operation part based on reflected light or diffracted light of the irradiated light, and performing process control of the semiconductor device based on a result of the measurement, the process control system comprising:

a first means of creating a calculation model from a predicted shape of the object pattern of the semiconductor device to be measured and calculating calculated waveforms of reflected light or diffracted light obtained when irradiating light onto the object pattern based on the calculation model;

a second means of performing a simulation with sequentially changing shape parameters of the calculation model, creating a library from a plurality of calculated waveforms obtained from the simulation, and storing the library to the database;

a third means of irradiating light onto the object pattern of the semiconductor device to be measured, and obtaining a detected waveform from reflected light or diffracted light of the irradiated light;

a fourth means of performing a matching of the library stored in the database and the detected waveform, and selecting a best-match calculated waveform;

a fifth means of, when the best-match calculated waveform cannot be selected by the fourth means of selecting the best-match calculated waveform, setting at least one parameter among the shape parameters as a fixed value based on information obtained by another measurement apparatus that uses a measurement method independent to the first to fourth means, performing the matching of the library and the detected waveform again, and selecting a best-match calculated waveform;

a sixth means of obtaining shape information of the object pattern from the best-match calculated waveform;

a seventh means of detecting variations in manufacture conditions from the obtained shape information; and an eighth means of reflecting detected information of the variations in the manufacture conditions to a manufacture process of the semiconductor device.

18. A process control system irradiating light on an object pattern of a semiconductor device during manufacture of the semiconductor device, measuring a shape of the pattern on the semiconductor device by a processing of an operation part based on reflected light or diffracted light of the irradiated light, and performing process control of the semiconductor device based on a result of the measurement, the process control system comprising:

a first means of creating a calculation model from a predicted shape of the object pattern of the semiconductor device to be measured and calculating calculated waveforms of reflected light or diffracted light obtained when irradiating light onto the object pattern based on the calculation model;

a second means of performing a simulation with sequentially changing shape parameters of the calculation model, creating a library from a plurality of calculated waveforms obtained from the simulation, and storing the library in the database;

a third means of, when calculated waveforms being the same exist in the library, confirming what kind of shape the waveforms are obtained from, and suggesting information necessary for distinguishing waveforms of calculated waveforms and another measurement apparatus that should be used to obtain the information on a display;

a fourth means of retrieving information measured by the another measurement apparatus based on the information suggested on the display;

a fifth means of setting at least one parameter among the shape parameters as a fixed value based on the information obtained by the another measurement apparatus;

a sixth means of irradiating light onto the object pattern of the semiconductor device to be measured and obtaining a detected waveform from reflected light or diffracted light of the irradiated light;

a seventh means of performing a matching of the library stored in the database and the detected waveform, and selecting a best-math waveform;

an eighth means of obtaining shape information of the object pattern from the best-match calculated waveform;

a ninth means of detecting variations in manufacture conditions from the obtained shape information; and a tenth means of reflecting detected information of the variations in manufacture conditions to a manufacture process of the semiconductor device.

19. The method of measuring a pattern shape according to claim 2, wherein
the measurement of the shape of the pattern on the pattern-attached substrate is an in-line measurement during manufacture of the pattern-attached substrate.

20. The method of manufacturing a semiconductor device according to claim 9, wherein
the variations in the manufacture conditions are detected by previously forming a wafer formed with varying the manufacture conditions, and obtaining a correlation between the manufacture conditions and shape information of the pattern obtained from reflected light or diffracted light from the pattern formed on the wafer.

* * * * *